(12) United States Patent
Uihlein et al.

(10) Patent No.: US 10,415,400 B2
(45) Date of Patent: Sep. 17, 2019

(54) MASKING METHOD FOR PRODUCING A COMBINATION OF BLADE TIP HARDFACING AND EROSION-PROTECTION COATING

(71) Applicant: MTU Aero Engines AG, Munich (DE)

(72) Inventors: Thomas Uihlein, Dachau (DE); Ralf Stolle, Wolfratshausen (DE)

(73) Assignee: MTU Aero Engines AG, Munich (DE)

( * ) Notice: Subject to any disclaimer, the term of this patent is extended or adjusted under 35 U.S.C. 154(b) by 421 days.

(21) Appl. No.: 15/152,671

(22) Filed: May 12, 2016

(65) Prior Publication Data
US 2016/0333706 A1 Nov. 17, 2016

(30) Foreign Application Priority Data
May 12, 2015 (DE) .......................... 10 2015 208 783

(51) Int. Cl.
*F01D 5/28* (2006.01)
*C23C 14/14* (2006.01)
(Continued)

(52) U.S. Cl.
CPC ............ *F01D 5/288* (2013.01); *B23K 1/0018* (2013.01); *B23K 1/19* (2013.01); *C23C 14/042* (2013.01);
(Continued)

(58) Field of Classification Search
None
See application file for complete search history.

(56) References Cited

U.S. PATENT DOCUMENTS 4,610,698 A * 9/1986 Eaton ...................... F01D 11/12
51/293
4,863,538 A * 9/1989 Deckard ................ B22F 3/004
156/272.8

(Continued)

FOREIGN PATENT DOCUMENTS

| DE | 102005060712 | 6/2007 |
| DE | 102010049398 A1 | 5/2011 |
| DE | 102013224566 | 6/2015 |

OTHER PUBLICATIONS

Tucker, Robert C., editor. "Introduction to Coating Design and Processing." ASM Handbook, vol. 5A, ASM International, 2013. Thermal Spray Technology, www.asminternational.org/documents/10192/1849770/05348G_Sample.pdf.*

Primary Examiner — Mary E McManmon
Assistant Examiner — Richard K. Durden
(74) Attorney, Agent, or Firm — Davidson, Davidson & Kappel, LLC

(57) ABSTRACT

A method for manufacturing a blade (1) for a turbomachine, the blade having a hardfacing on its tip (4) and an erosion-protection coating (13) at least on its airfoil (3) is provided. Initially, a blade tip hardfacing is applied to the blade tip and, subsequently, a mask (10) is positioned in the region of the blade tip hardfacing, the mask covering the blade tip hardfacing, and, subsequently, the erosion-protection coating is deposited. The mask is removed after the erosion-protection coating is completed. A blade for a turbomachine, the blade having a hardfacing on its tip (4) and an erosion-protection coating (13) at least on its airfoil (3) is also provided. The erosion-protection coating at least partially covers the blade tip hardfacing, and the thickness of the erosion-protection coating decreases continuously in and/or toward the region of the blade tip hardfacing.

8 Claims, 3 Drawing Sheets

(51) Int. Cl.
*F01D 5/14* (2006.01)
*F01D 11/12* (2006.01)
*C23C 14/04* (2006.01)
*C23C 28/00* (2006.01)
*B23K 1/00* (2006.01)
*B23K 1/19* (2006.01)
*C23C 14/06* (2006.01)
*C23C 14/34* (2006.01)
*C23C 14/35* (2006.01)
*C25D 3/12* (2006.01)
*C25D 7/00* (2006.01)
*C25D 9/04* (2006.01)
*B23K 101/34* (2006.01)
*B23K 103/16* (2006.01)

(52) U.S. Cl.
CPC ........ *C23C 14/044* (2013.01); *C23C 14/0647* (2013.01); *C23C 14/14* (2013.01); *C23C 14/34* (2013.01); *C23C 14/35* (2013.01); *C23C 28/00* (2013.01); *C23C 28/324* (2013.01); *C23C 28/345* (2013.01); *C25D 3/12* (2013.01); *C25D 7/00* (2013.01); *C25D 9/04* (2013.01); *F01D 5/147* (2013.01); *F01D 5/286* (2013.01); *F01D 11/122* (2013.01); *B23K 2101/34* (2018.08); *B23K 2103/16* (2018.08); *F05D 2220/323* (2013.01); *F05D 2230/313* (2013.01); *F05D 2240/307* (2013.01); *F05D 2300/16* (2013.01); *F05D 2300/228* (2013.01); *F05D 2300/506* (2013.01); *F05D 2300/611* (2013.01)

(56) References Cited

U.S. PATENT DOCUMENTS

| | | | |
|---|---|---|---|
| 5,551,840 A * | 9/1996 | Benoit | F01D 11/12 416/241 B |
| 5,565,035 A | 10/1996 | Sylvestro et al. | |
| 5,704,759 A * | 1/1998 | Draskovich | F01D 11/12 415/170.1 |
| 5,803,971 A | 9/1998 | Menchetti et al. | |
| 5,952,110 A * | 9/1999 | Schell | F01D 11/12 205/109 |
| 6,434,876 B1 * | 8/2002 | Wheat | C23C 10/52 427/203 |
| 7,473,072 B2 * | 1/2009 | Malak | C23C 28/00 415/173.4 |
| 7,510,370 B2 * | 3/2009 | Strangman | C23C 26/02 415/173.4 |
| 8,740,572 B2 | 6/2014 | Hoebel et al. | |
| 2003/0132119 A1 * | 7/2003 | Ohara | F01D 11/12 205/109 |
| 2011/0116912 A1 * | 5/2011 | McCall | C23C 14/042 415/177 |
| 2013/0230402 A1 * | 9/2013 | Levine | F01D 5/188 416/95 |
| 2015/0151321 A1 * | 6/2015 | Brett | B05D 1/32 428/157 |
| 2016/0010197 A1 * | 1/2016 | Strock | F01D 25/285 427/259 |

* cited by examiner

MASKING METHOD FOR PRODUCING A COMBINATION OF BLADE TIP HARDFACING AND EROSION-PROTECTION COATING

This claims the benefit of German Patent Application DE102015208783.2, filed May 12, 2015 and hereby incorporated by reference herein.

The present invention relates to a method for manufacturing a blade for a turbomachine, the blade having a hardfacing on its tip and an erosion-protection coating at least on its airfoil. The present invention also relates to a corresponding blade for a turbomachine such as, for example, a stationary gas turbine or an aircraft engine.

BACKGROUND

Turbomachines, such as stationary gas turbines or aircraft engines, include, inter alia, a plurality of blades rotatably mounted on a rotor so as to either compress the fluid flowing through the turbomachine or to be driven into rotation by the fluid.

In order to minimize flow losses between the rotating blades and a surrounding flow duct boundary, the gap between the blade tips at the radial ends of the blades and the flow duct boundary must be as small as possible in order that as little fluid as possible may flow through the gap between the flow duct boundary and the blades.

For this reason, in known turbomachines, so-called labyrinth seals are provided for sealing between the blade tips and the flow duct boundary. In such labyrinth seals, the blade tips move in a groove which is formed by the blade tips cutting into a sealing material on the flow duct boundary during operation of the turbomachine. In this connection, it is also known to provide the blade tips with so-called blade tip hardfacings. Blade tip hardfacings have particles of hard material embedded in a metal matrix, which are intended to cut the groove for the labyrinth seal into the opposite sealing material of the flow duct boundary and to protect the blade tip from wear.

Moreover, blades of turbomachines also include protective coatings, such as erosion-protection coatings, on the airfoil to also protect the blade material in the airfoil region from wear caused, for example, by erosion.

Accordingly, a blade of a turbomachine must be provided with different coatings adjacent to one another, such as, for example, a hardfacing on the tip and an erosion-protection coating on the airfoil. However, care must be taken that none of the coatings, especially the blade tip hardfacing, becomes covered by the other coating, namely the erosion-protection coating, because the covered coating; i.e., for example, the blade tip hardfacing, is otherwise unable to perform its function in the desired manner. In fact, in the event of a failure of the cutting function of the blade tip hardfacing, the blade can be massively damaged by excessive thermal and mechanical loading.

Accordingly, the individual coatings must be suitably applied one after another while preventing unwanted mutual coverage of the coatings.

DE 10 2010 049 398 A1 describes a wear- and oxidation resistant turbine blade including an oxidation-resistant metallic coating, in particular an MCrAlY coating, in which M is a metal, in particular nickel, cobalt, or a combination thereof, and which, in addition, may have a ceramic thermal barrier coating. In addition to this oxidation-resistant protective coating, a protective coating of abrasive material and binder material is applied to the blade tip by laser metal forming. Initially, the oxidation-resistant protective coating in the form of the MCrAlY coating is applied to the blade over the entire surface thereof. Then, the MCrAlY coating is mechanically removed in the region of the blade tip, and subsequently the wear-resistant protective coating is applied to the blade tip in the blade tip region by laser metal forming.

SUMMARY OF THE INVENTION

This method is complex and error-prone because the protective coating may be further damaged during removal of the oxidation-resistant protective coating in the region of the blade tip. Moreover, the oxidation-resistant protective coating may become damaged or covered during the laser metal forming process.

It is an object of the present invention to provide a method for manufacturing a blade for a turbomachine, where at least two different coatings can be provided on the blade in a simple and reliable manner without mutual impairment of the function and quality of the individual coatings. More specifically, it is an object to apply a blade tip hardfacing and an erosion-protection coating adjacent to each other to a blade of a turbomachine in an efficient manner while preventing the erosion-protection coating in particular from covering the blade tip hardfacing and thus impairing the functioning of the blade tip hardfacing. Another object of the present invention is to provide a corresponding blade for a turbomachine such as, for example, a stationary gas turbine or an aircraft engine.

In a method for manufacturing a blade for a turbomachine, it is proposed in accordance with the present invention to initially apply a blade tip hardfacing to the blade tip and to subsequently position a mask in the region of the blade tip hardfacing, which mask covers the blade tip hardfacing during the subsequent deposition of an erosion-protection coating, so that at least the thickness of the coating deposited in the region of the blade tip hardfacing is reduced to such an extent that it does not have any adverse properties with respect to the functioning of the blade tip hardfacing.

Preferably, the mask is positioned at a distance from the blade tip hardfacing, so that, during deposition of the erosion-protection coating, no transition is produced between the erosion-protection coating contacting the blade and the erosion-protection coating formed on the mask. This makes it possible to prevent the erosion-protection coating from being damaged during subsequent removal of the mask, and especially from becoming detached outside of the areas of the mask, which would result in unprotected areas on the blade. In contrast, by positioning the mask at a distance from the blade tip hardfacing, and thus from the blade as a whole, a smooth transition is obtained in the erosion-protection coating from the airfoil to the blade tip hardfacing. In the process, the blade tip hardfacing may be at least partially covered by the erosion-protection coating. However, due to the masking of the blade tip hardfacing during the deposition of the erosion-protection coating, the thickness of the erosion-protection coating in the region of the blade tip hardfacing is significantly reduced, so that the effect of the blade tip hardfacing can fully manifest itself, at least after a short period of use during which the thin erosion-protection coating is removed in the region of the blade tip hardfacing. Thus, the smooth transition from a thick erosion-protection coating in the region of the airfoil to a thin erosion-protection coating in the region of the blade tip hardfacing ensures that no unprotected areas are present on the blade. In the region of the blade tip hardfacing, the thickness of the erosion-protection coating may also tend towards zero. In addition, the smooth transition and the associated decrease in the thickness of the erosion-protection coating toward the blade tip hardfacing also ensures adhesion of the erosion-protection coating, while at the same time ensuring that the function of the blade tip hardfacing is maintained.

The relative terms used in connection with the erosion-protection coating, such as "thin," "thick," "thinner," and "thicker" in each instance refer to a comparison between the respective areas of the erosion-protection coating in the region of the airfoil and in the region of the blade tip, respectively blade tip hardfacing, so that the expression "thick erosion-protection coating in the region of the airfoil" merely indicates that the coating thickness in this region is greater than in the region of the blade tip hardfacing.

The shape of the mask used for masking the blade tip hardfacing may be selected to replicate, or correspond to, the shape of blade tip, respectively the top surface or top side of the blade tip, respectively of the blade tip hardfacing. The replica can be both two-dimensional and three-dimensional. A two-dimensional replica may be produced by projecting the surface shape of the blade tip, respectively the blade tip hardfacing, onto a plane.

The shape and/or dimensioning of the mask may be selected such that the mask partially or completely overhangs the region of the blade tip hardfacing, respectively the blade tip. The mask may also be selected to be smaller in order to achieve a larger overlapping region of the blade tip hardfacing and the erosion-protection coating. It is also possible to vary the distance at which the mask is positioned from the blade tip hardfacing, respectively the blade tip, in order to control the thickness of the deposited erosion-protection coating in the region of the blade tip hardfacing and/or the transition of the erosion-protection coating from the airfoil to the blade tip.

The mask may be supported in the region of the leading edge and/or trailing edge of the blade by suitable holding elements, such as posts. Furthermore, the mask may be manufactured using an additive manufacturing technique in which the mask and/or corresponding holding elements are manufactured layer by layer from powder material, such as by selective laser melting, selective electron beam melting, or the like, in order to enable simple manufacture of a sophisticated structure.

The mask, and particularly the thickness thereof, may be dimensioned such that the mask has sufficient stability, especially with respect to the effects occurring during the subsequent deposition of the erosion-protection coating, and in particular such that it is not deformed by temperature effects and resulting temperature changes or the like.

The mask may be dimensioned and/or positioned such that the erosion-protection coating in the region of the blade tip hardfacing has a maximum or average thickness less than half, preferably less than or equal to one-third, in particular less than or equal to 10%, of the average thickness of the remaining erosion-protection coating, in particular the erosion-protection coating in the region of the airfoil.

The blade tip hardfacing may be applied using any suitable technique, such as by electrodeposition of, for example, a nickel matrix with embedded particles of hard material, such as boron nitride particles, or build-up brazing or deposition of a slurry coating.

The erosion-protection coating may be deposited by physical vapor deposition (PVD) In this connection, it is possible to use, in particular, thermal evaporation, arc evaporation, electron-beam evaporation, sputtering and/or magnetron sputtering.

BRIEF DESCRIPTION OF THE DRAWINGS

The accompanying drawings show purely schematically in

DETAILED DESCRIPTION

Other advantages, characteristics and features of the present invention will become apparent from the following detailed description of exemplary embodiments. However, the present invention is not limited to such exemplary embodiments.

Figure 1:
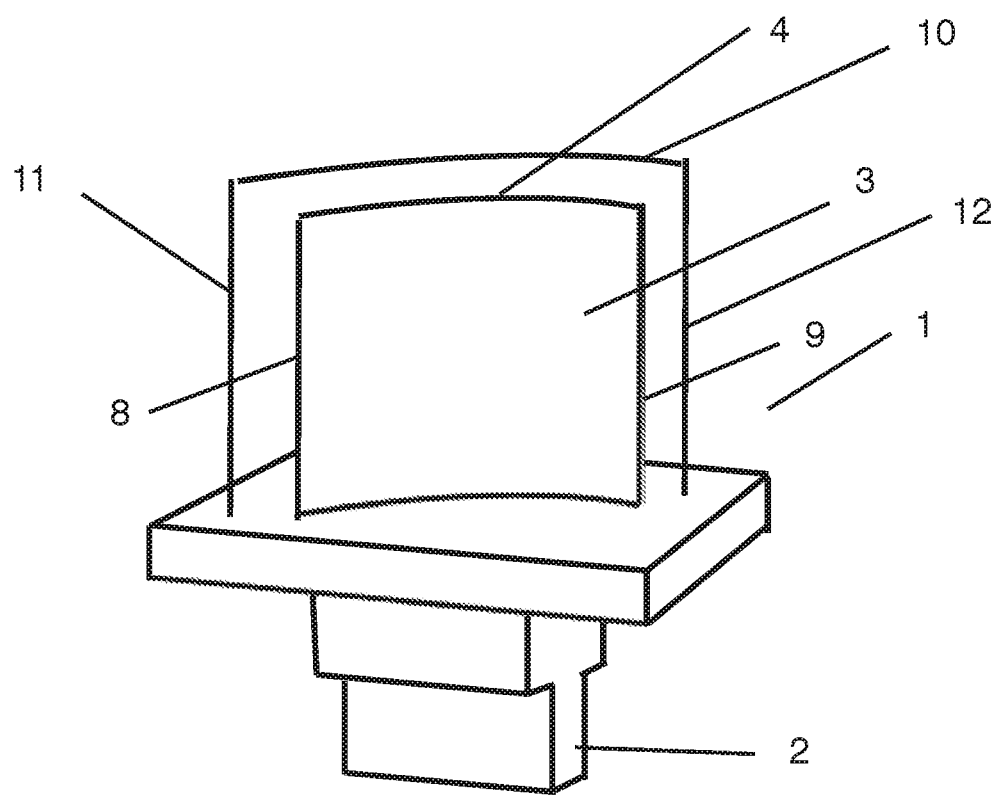
FIG. 1: a perspective view of a blade, such as may be used in turbomachines, with a mask for the deposition of an erosion-protection coating.

FIG. 1 shows, in a purely schematic perspective view, a blade as may be used in a turbomachine, such as, for example, a stationary gas turbine or an aircraft engine. Blade 1 has a blade root 2 which may be inserted into a disk which rotates with a shaft of the turbomachine. Blade 1 further has an airfoil 3 which is disposed in the flow duct of the turbomachine and which either compresses the fluid flowing through the turbomachine or is driven by the passing fluid. Located at the radially outer end of blade 1 is the blade tip 4, which, in order to prevent flow losses, lies as closely adjacent as possible to a surrounding flow duct casing or even cuts into the same. To this end, blade tip 4 is provided with a blade tip hardfacing (see FIG. 3) which also has a cutting function, allowing blade tip 4 to cut into a surrounding flow duct casing, respectively into sealing material attached thereto. The blade tip hardfacing may be formed by, for example, a coating containing a nickel matrix 6 with cubic boron nitride particles 7 embedded therein.

Airfoil 3 also has a coating for protecting blade 1, this coating being an erosion-protection coating intended to protect the material of blade 1 from erosive wear. Such an erosion-protection coating may be composed of a multi-layer coating which may be formed by a plurality of alternately deposited hard and soft layers, in particular ceramic layers and metal layers.

FIG. 1 further shows that, for applying an erosion-protection coating that is to be deposited mainly on the airfoil as well as on leading edge 8 and trailing edge 9 of the blade, the region of blade tip 4 is masked by a mask 10 which is held by two posts 11,12 located in the region of leading edge 8 and trailing edge 9.

As shown in the schematic view of FIG. 1, mask 10 is positioned at a distance from blade tip 4. This distance may be selected to be very small.

Mask 10 is shaped to correspond to the shape of blade tip 4 and, accordingly, also has a curved shape, as shown in the embodiment of FIG. 1.

Figure 2:
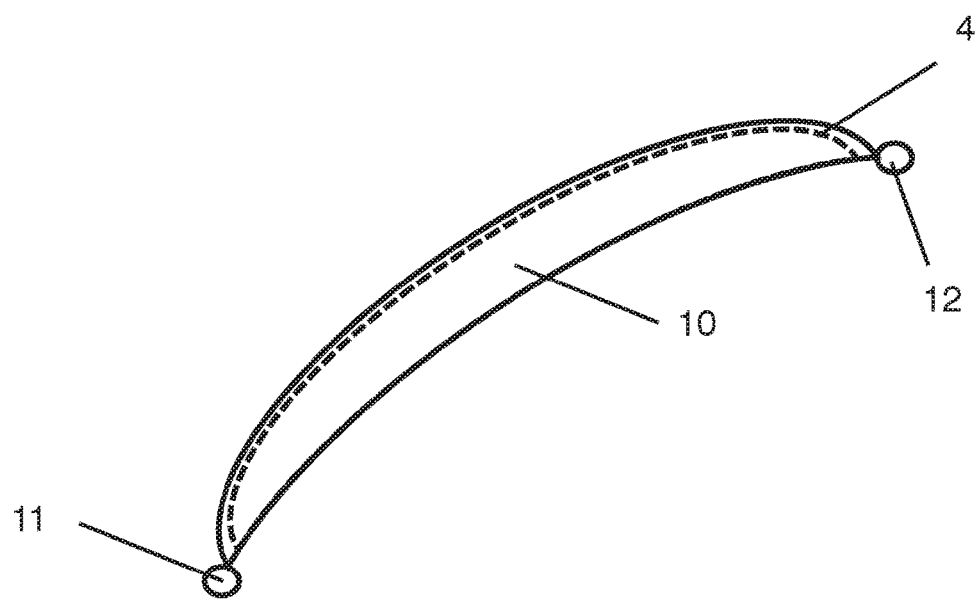
FIG. 2: a top view showing the airfoil of the blade of FIG. 1 without the blade root, but with the mask positioned thereabove, and in FIG. 3: a portion of a turbine blade after various steps of the inventive method as illustrated in subfigures a) through e).

FIG. 2 shows the blade of FIG. 1 in a top view in which only the airfoil is shown by a dashed line and which illustrates the arrangement of mask 10 from above. It is clear that mask 10 corresponds to the shape of blade tip 4, and in particular of the top surface thereof, in terms of its dimensions and its shape in a plane transverse to the radial direction of the blade 1. As can clearly be seen in FIG. 2, mask 10 has the same banana-shaped configuration as the top surface of blade tip 4. In the view of FIG. 2, mask 10 is configured with a small overhang, making it slightly larger than the top surface of blade tip 4. However, instead of being oversized, mask 10 may also be dimensioned slightly smaller than the top surface of blade tip 4, depending on the desired amount of coverage of blade tip hardfacing 5 with erosion-protection coating 13,14. For this purpose, it is also possible to vary the distance at which mask 10 is positioned from blade tip 4. In the extreme case, mask 10 may also rest directly on blade tip 4.

Figure 3:
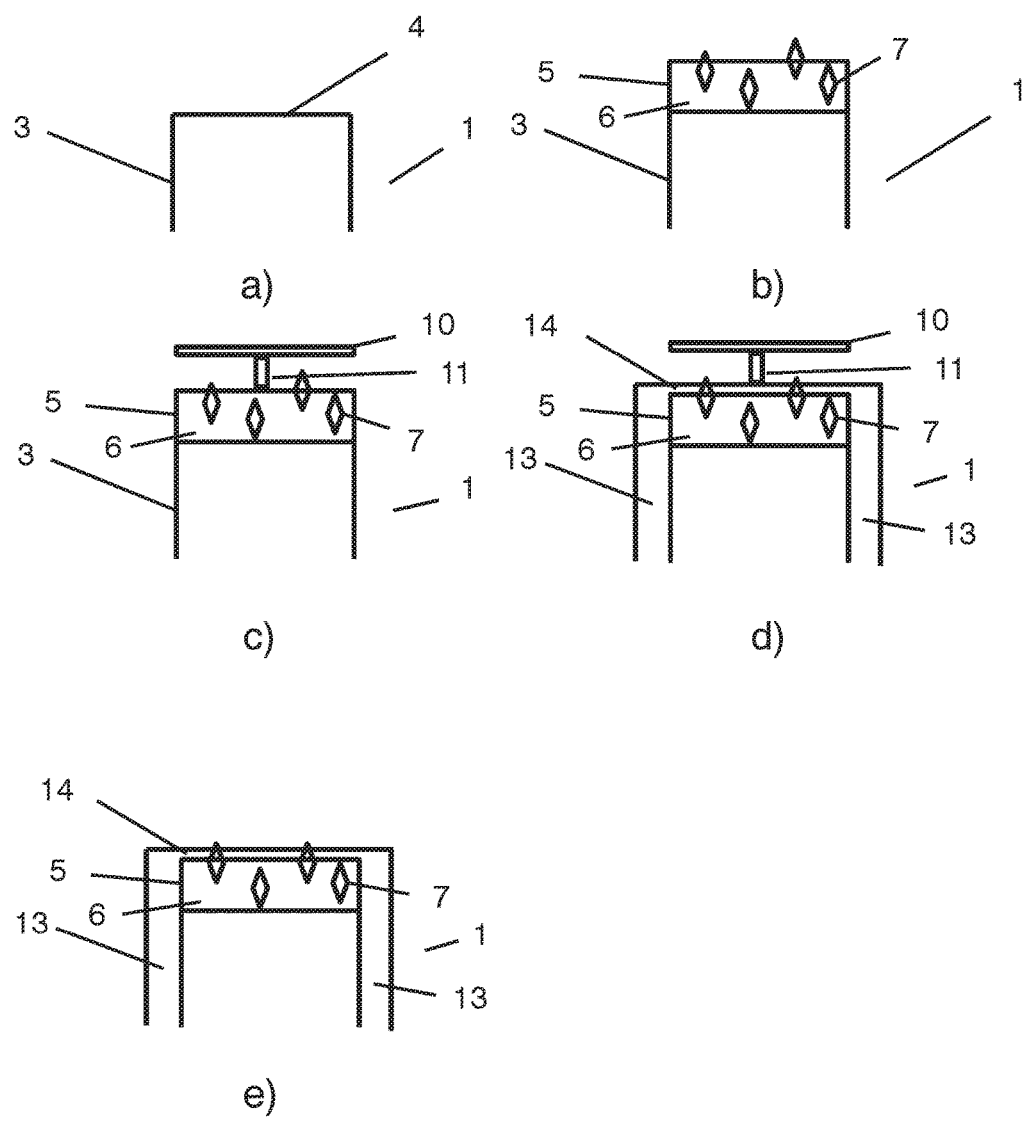

FIG. 3 illustrates in subfigures a) through e) the various stages during the manufacture of a blade having a blade tip hardfacing on blade tip 4 and an erosion-protection coating on airfoil 3. Subfigure a) of FIG. 3 shows a portion of a blade 1 including airfoil 3 and blade tip 4.

As shown in FIG. 3b), a blade tip hardfacing 5 is applied to blade tip 4, the hardfacing being composed of a nickel matrix 6 and cubic boron nitride particles 7 embedded therein. The application of blade tip hardfacing 5 is accomplished, for example, by electrodeposition of nickel matrix 6 in which the cubic boron nitride particles are embedded. However, the blade tip hardfacing may also be accomplished in any other suitable manner.

After blade tip hardfacing 5 is completed, mask 10 is positioned so that erosion-protection coating 13,14 can be applied (see FIG. 3c)).

Erosion-protection coating 13,14 can be deposited by physical vapor deposition (PVD) and, more specifically, by depositing the respective sub-layers of the multi-layer erosion-protection coating using various techniques of thermal evaporation or sputter deposition. In the process, blade 1 is coated over its entire surface both on airfoil 3 and on blade tip 4 on top of blade tip hardfacing 5. However, mask 10 reduces the deposition of the erosion-protection coating in the region of blade tip 4, so that the erosion-protection coating 14 obtained is thinner compared to the thicker erosion-protection coating 13 in the region of airfoil 3 (see FIG. 3d)). In particular, the thickness of erosion-protection coating 14 in the region of blade tip 4 is so small that the particles of hard material in the form of boron nitride particles 7 which are embedded in the tip hardfacing project out of erosion-protection coating 14. In any case, the thin erosion-protection coating 14 in the region of blade tip 4, respectively blade tip hardfacing 5, is so thin that it does not impair the cutting effect of the particles of hard material, respectively BN particles 7.

Following the deposition of erosion-protection coating 13,14, mask 10 and its supporting posts 11,12 are removed, leaving a blade 1 which has a thicker erosion-protection coating 13 in the region of the airfoil and a thinner erosion-protection coating 14 in the region of the blade tip, respectively blade tip hardfacing 5. In this connection, the relative terms "thicker" and "thinner" each refer to the respective other portion of erosion-protection coating 13,14.

Blade tip hardfacing 5 is embedded in and surrounded by the adjoining erosion-protection coating 13 without the erosion-protection coating excessively covering the abrasive surface of blade tip hardfacing 5 that is in contact with a sealing material located opposite thereto.

Although the present invention has been described in detail with reference to the above exemplary embodiments, it is not limited to such exemplary embodiments. Rather, various modifications may be made by omitting individual features or by combining features in different ways, without departing from the protective scope of the appended claims.

LIST OF REFERENCE NUMERALS

1 blade
2 blade root
3 airfoil
4 blade tip
5 blade tip hardfacing
6 Ni matrix
7 BN particle
8 leading edge
9 trailing edge
10 mask
11,13 post
13 erosion-protection coating on the airfoil
14 erosion-protection coating in the region of the blade tip

What is claimed is:

1. A blade for a turbomachine, the blade comprising:
 a tip;
 an airfoil having a leading edge and a trailing edge;
 a hardfacing on the tip and an erosion-protection coating at least on the airfoil, the hardfacing having hardfacing sides extending from the leading edge and the trailing edge and a hardfacing outer surface extending between the hardfacing sides;
 the erosion-protection coating at least partially covering the tip hardfacing on the hardfacing outer surface, a thickness of the erosion-protection coating decreasing continuously in or toward a region of the tip hardfacing wherein a maximum or average thickness of the erosion-protection coating on the hardfacing outer surface is less than half of the average thickness of a remaining erosion-protection coating.

2. The blade as recited in claim 1 wherein the maximum or average thickness of the erosion-protection coating on the hardfacing outer surface is less than one-third of the average thickness of the remaining erosion-protection coating.

3. The blade as recited in claim 2 wherein the maximum or average thickness of the erosion-protection coating on the hardfacing outer surface is less than 10% of the average thickness of the remaining erosion-protection coating.

4. The blade as recited in claim 1 wherein the tip hardfacing is surrounded by or embedded in the erosion-protection coating.

5. The blade as recited in claim 4 wherein boron nitride particles in the blade tip hardfacing extend through the erosion protection coating on the hardfacing outer surface.

6. A method for manufacturing a blade for a turbomachine, the blade having a tip and an airfoil, the blade having hardfacing on the tip and an erosion-protection coating at least on the airfoil, the method comprising;
 applying initially a blade tip hardfacing to the blade tip, the hardfacing having hardfacing sides and a hardfacing outer surface extending between the hardfacing sides; and
 positioning subsequently a mask in the region of the blade tip hardfacing, the mask covering the blade tip hardfacing outer surface;
 depositing subsequently the erosion-protection coating; and
 removing the mask after the erosion-protection coating is deposited, the erosion protection coating the airfoil and at least partially coating the hardfacing outer surface wherein the erosion protection coating covers the hardfacing outer surface with a thickness less than the erosion protection coating on the hardfacing sides.

7. The method as recited in claim 6 wherein boron nitride particles in the hardfacing project out of the erosion protection coating.

8. The method as recited in claim 6 wherein the erosion protection coating on the hardfacing outer surface is removed during use.

\* \* \* \* \*